(12) United States Patent
Rim

(10) Patent No.: US 6,815,738 B2
Rim
(45) Date of Patent: Nov. 9, 2004

(54) MULTIPLE GATE MOSFET STRUCTURE WITH STRAINED SI FIN BODY

(75) Inventor: Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/377,388

(22) Filed: Feb. 28, 2003

(65) Prior Publication Data

US 2004/0169239 A1 Sep. 2, 2004

(51) Int. Cl.[7] .............................................. H01L 29/80
(52) U.S. Cl. .................... 257/256; 257/66; 257/213; 257/262; 257/347; 257/350
(58) Field of Search ........................ 257/66, 213, 256, 257/262, 347, 350

(56) References Cited

U.S. PATENT DOCUMENTS

| | | | |
|---|---|---|---|
| 6,059,895 A | 5/2000 | Chu | 148/33.1 |
| 6,458,662 B1 | 10/2002 | Yu | 438/286 |
| 6,475,869 B1 * | 11/2002 | Yu | 438/303 |
| 6,602,613 B1 * | 8/2003 | Fitzgerald | 428/641 |

\* cited by examiner

*Primary Examiner*—Long Pham
*Assistant Examiner*—Wai-Sing Louie
(74) *Attorney, Agent, or Firm*—George Sai-Halasz

(57) ABSTRACT

A method is disclosed for fabricating multifaceted, tensilely strained Si MOSFET (FinFET) devices. The method comprises the growing by selective epitaxy of a monocrystalline Si strip onto a monocrystalline SiGe layer sidewall surface, where the SiGe layer is bonded to a support platform, typically an insulator on a Si substrate, and where the Si strip also bonds to the support platform. The SiGe sidewall surface has a lattice constant which is larger than the relaxed lattice constant of Si, whereby the Si strip is in a tensilely strained state. Upon removing the SiGe monocrystalline layer the monocrystalline strained Si strip is turned into a multifaceted Si strip on the support platform, suitable for fabricating multifaceted gate FinFETs. Fabrication of processors with such FinFet devices is also disclosed.

28 Claims, 5 Drawing Sheets

MULTIPLE GATE MOSFET STRUCTURE WITH STRAINED SI FIN BODY

FIELD OF THE INVENTION

The present invention relates to a method for fabricating a strained silicon strip on a supporting platform. In particular the invention relates to a method for producing a multifaceted gate MOSFET transistor using a tensilely strained Si strip on an insulator. The invention also teaches a method for fabricating processors which comprise the disclosed method for producing the strained silicon layer multifaceted gate MOSFETs.

BACKGROUND OF THE INVENTION

Today's integrated circuits include a vast number of devices. Smaller devices are key to enhance performance and to improve reliability. As MOSFET (Metal Oxide Semiconductor Field-Effect-Transistor, a name with historic connotations meaning in general an insulated gate Field-Effect-Transistor) devices are being scaled down, however, the technology becomes more complex and changes in device structures and new fabrication methods are needed to maintain the expected performance enhancement from one generation of devices to the next. In this regard the semiconductor that has progressed the farthest is the primary semiconducting material of microelectronics: silicon (Si).

There is great difficulty in maintaining performance improvements in devices of deeply submicron generations. Several avenues are being explored for keeping device performance improvements on track. Among these is the use of tensilely strained Si as the basic semiconducting device material. The strained Si layer is typically formed by growing Si epitaxially over a relaxed graded SiGe (Ge stands for germanium) based layer as discussed, for instance, in Materials Science and Engineering Reports R17, 105 (1996), by P. M. Mooney, and in U.S. Pat. No. 5,659,187 to LeGoues et al. titled: "Low Defect Density/arbitrary Lattice Constant Heteroepitaxial Layers" incorporated herein by reference. Tensile strain in the Si has significant advantages. For instance, a heterostructure consisting of relaxed $Si_{0.7}Ge_{0.3}$ capped with a thin (20 nm) strained Si layer has electron and hole mobilities over 80% higher than bulk Si. The higher mobility leads to faster switching speed, higher "on" current, and lower power dissipation. MOSFETs fabricated in tensile strained Si exhibits higher carrier mobilities than conventional MOSFET as it was shown, for instance, in "NMOS and PMOS transistors fabricated in strained silicon/relaxed silicon-germanium structures", by Welser, J. et al., 1992 IEDM Tech Dig., pp. 1000–1002. Fabrication of a tensilely strained Si layer is also taught in US patent application titled: "Strained Si based layer made by UHV-CVD, and Devices Therein", by J. Chu et al, filed Feb. 11, 2002, Ser. No. 10/073,562, incorporated herein by reference.

Strained-Si layers are the result of biaxial tensile stress induced in silicon grown on a substrate formed of a material whose lattice constant is greater than that of silicon. The lattice constant of germanium is about 4.2% greater than that of silicon, and the lattice constant of a silicon-germanium alloy is linear with respect to its germanium concentration. As a result, the lattice constant of a SiGe alloy containing fifty atomic percent germanium is about 2% greater than the lattice constant of silicon. Epitaxial growth of silicon on such a SiGe substrate will yield a silicon layer under tensile strain, with the underlying SiGe substrate being essentially unstrained, or "relaxed."

A structure and process that realizes the advantages of a strained-Si channel structure for MOSFET application is taught in the commonly-assigned U.S. Pat. No. 6,059,895 to Chu et al., incorporated herein by reference, which discloses a technique for forming a CMOS device having a strained-Si channel on a SiGe layer, all on an insulating substrate. Since most commonly the semiconducting layer in which devices are fabricated is Si, the technology carries the terminology of SOI (Si on insulator), and the buried insulator is $SiO_2$, to yield the name of BOX (buried oxide).

However, there are still many outstanding issues in achieving the highest possible performance in deeply submicron MOSFET devices. With shortening gate lengths, the so called short channel effects, most notably the "drain induced barrier lowering" (DIBL) pose severe roadblocks to miniaturization. These effects can be mitigated by introducing basic structural changes in the devices, leading to the use of multiple gates. However, this approach can only yield the desired performance improvements if it is appropriately coupled with other high performance techniques, such as with strained Si and with SOI, a problem that is still looking for solutions.

SUMMARY OF THE INVENTION

In view of the problems discussed above this invention discloses a method for fabricating multifaceted, or multiple gated MOSFET devices, (commonly known as FinFET devices) in a tensilely strained Si on an insulator. Such a device is not simply a planar structure conducting on one surface, but conducting on more than one side, or facet on the surface of a device body. The reasons that a multifaceted gate device can be downscaled further than a regular planar device are relatively complex, but they have been already given in the technical literature, for instance in: "Device Design Considerations for Double-Gate, Ground-Plane, and Single-Gated Ultra-Thin SOI MOSFET's at the 25 nm Channel Length Generation," by H.-S. P. Wong, et al, 1998 IEDM Tech Dig., pp. 407–10.

The distinct advantages of a strained Si FinFET could be best realized with a strained-Si structure that does not include the strain-inducing layer, but instead has a strained-Si layer that is directly on another layer, such as an insulator layer to yield a strained SOI structure. Conventional wisdom has been that the SiGe layer must be present at all times to maintain the strain in the silicon layer. However, such is not the case, as was disclosed in the US patent application "Method of Forming Strained Silicon on Insulator and Structures Formed Thereby" by K. Rim, filed on Mar. 31, 2001, Ser. No. 09/823,855, incorporated herein by reference.

Accordingly, it is the object of the present invention to teach a method by which a strained material strip on a support platform can be fabricated.

It is also an object of the present invention to teach a method to have such a strip of Si made suitable for FinFET fabrication.

It is a further object of the present invention to teach a method for FinFET fabrication with strained Si.

And furthermore, the present invention teaches a method for fabricating a processor which comprises the strained Si FinFET devices produced by the disclosed method.

BRIEF DESCRIPTION OF THE DRAWINGS

These and other features of the present invention will become apparent from the accompanying detailed description and drawings, wherein.

DETAILED DESCRIPTION OF THE INVENTION

Figure 1A:
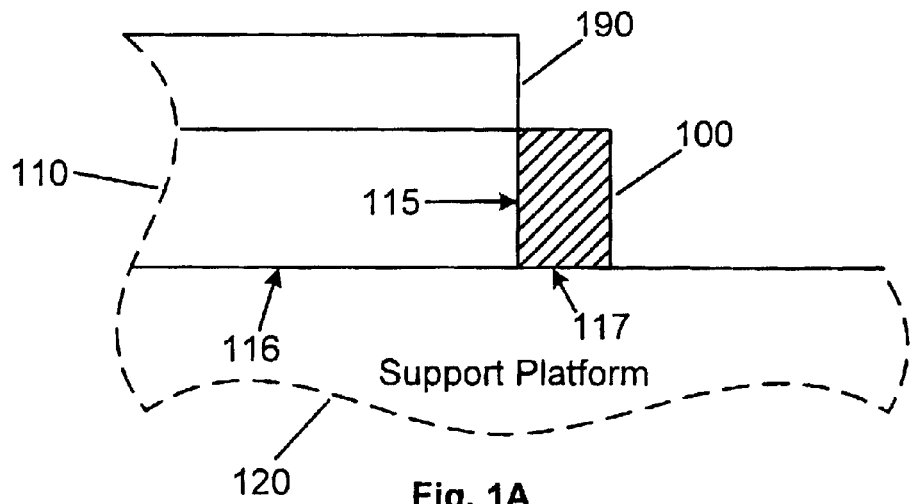
FIG. 1 shows in schematic cross sectional views a strained material strip grown on a sidewall surface of a crystalline layer, suitable for FinFET fabrication.

FIG. 1 shows a schematic cross sectional view of a strained material strip grown on a sidewall surface of a crystalline layer. According to FIG. 1A, the method starts with a first monocrystalline layer 110. This first monocrystalline layer 110 has its bottom surface 116 bonded to a support platform 120. A monocrystalline strip of a first material 100 is grown by selective epitaxy onto the sidewall surface 115 of the first monocrystalline layer 110. During the growth the monocrystalline first material strip 100 may also bonding through the interface 117 to the support platform, but as long as the first monocrystalline layer 110 is in place, such bonding through the interface 117 is not necessary for maintaining the strain in the first material strip. Layer 190 is optional, it is a so called sacrificial cover layer, its role being the prevention of growth of the first material strip on the top of the first monocrystalline layer 110. The critical point is that the sidewall surface 115 has a lattice constant which is different than the lattice constant of the first material in its relaxed state. Since the first material strip 100 is grown epitaxially, it is being forced to comply with the lattice constant of the sidewall surface 115. If the sidewall surface 115 has a lattice constant is larger than the lattice constant of the first material in its relaxed state, the first material strip will be acquiring a tensile strain. If the sidewall surface 115 has a lattice constant is smaller than the lattice constant of the first material in its relaxed state, the first material strip will be acquiring a compressive strain.

In one embodiment of the invention the first material is a Si based material. Such Si based material of note is, for instance, a SiGe alloy, possibly with further additions of small amount of substances, such as C. It a preferred embodiment the first material is Si itself.

Figure 1B:
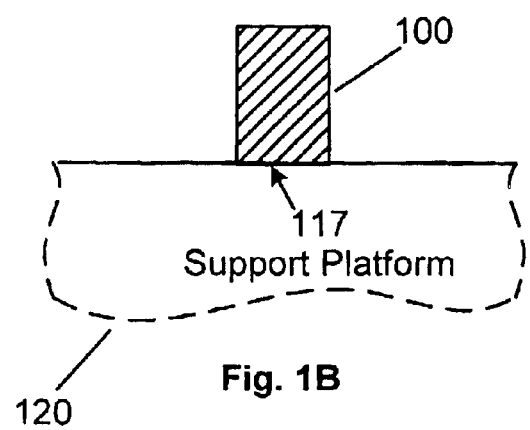

FIG. 1B shows schematically the tensilely strained Si strip 100, following the removal of the first monocrystalline layer 110. If one wants to realize such a mulifaceted Si 100 strip without the first monocrystalline layer 110 bonding to the support platform at interface 117 is necessary. The Si strip maintains its strained state through its bonding to the support platform 120 at their interface 117. At this point the removal of the first monocrystalline layer 110 turned the Si strip 100 into a multifaceted Si strip 100 bonded to the support platform 117 and suitable for fabricating a multifaceted gate MOSFET (FinFET). The removal of the first monocrystalline layer 110 follows know techniques in the semiconductor processing arts. Such removals are usually performed by selective etching, and depending on the circumstances either dry, or wet techniques can be applied. FIGS. 1A and 1B are only schematic. One skilled in the processing arts, for instance, would recognize that the shape and aspect ratios of the Si strip 100 can have many variations.

In a preferred embodiment of the invention the first monocrystalline layer 110 is a relaxed monocrystalline SiGe layer, with the Ge concentration determining the degree of tensile strain in the Si strip 100. But this first monocrystalline layer 110 can be any material with the proper crystal structure and lattice constant, such as, but not limited to, a III–V compound semiconductor. By properly choosing the sidewall surface 115 orientation the facets of the Si strip 100 have the preferred crystalline orientation for MOSFET applications, which is typically (100). In a preferred embodiment the support platform 120 is chosen to comprise of a $SiO_2$ layer on a Si substrate. Having the strained Si strip 100 on a so called buried oxide layer (BOX) bestows on the precessed FinFET devices all the known advantages of an SOI technology. In an alternate embodiment the support platform is a graded SiGe layer on a Si substrate.

FIG. 2 shows schematic cross sectional views of a preferred method for fabricating strained Si multifaceted devices on a support platform. FIG. 2A shows the view of the first monocrystalline layer, or the relaxed SiGe layer 110, which has at least one, or as shown in the figures actually two, sidewall surfaces, following a deposition of the sacrificial cover layer 190. This sacrificial cover layer 190 is a dielectric layer, typically an oxide, or a nitride. The strained Si layer 100 has been grown on the sidewall surface of layer 110. As in FIG. 1, the relaxed SiGe layer 110 and the strained Si strips 100 are bonding to the support platform 120. Here too, the support platform is preferably a BOX layer, or a graded SiGe layer.

Figure 2A:
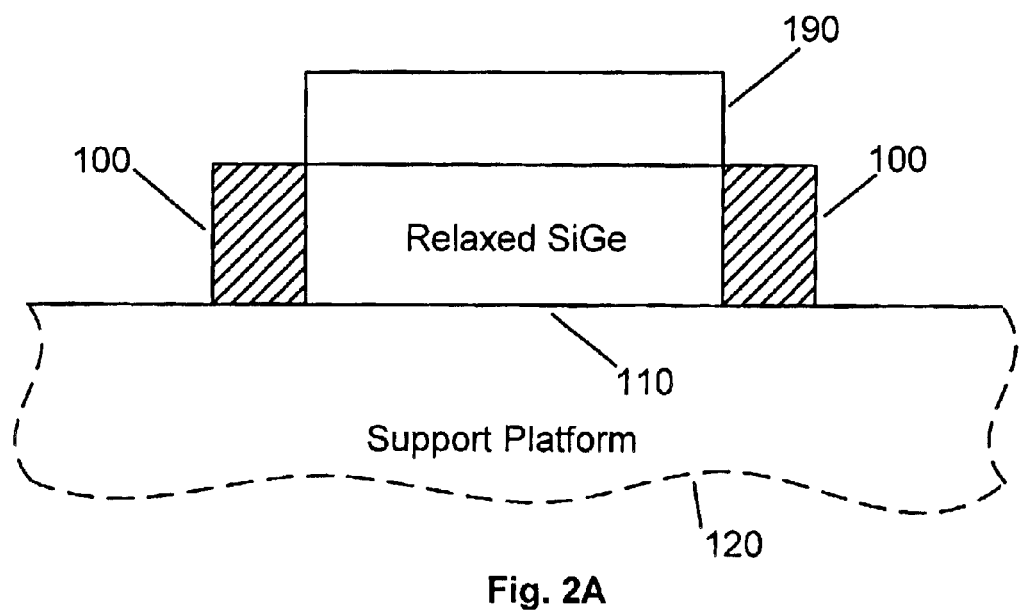
FIG. 2 shows schematic cross sectional views of a preferred method for fabricating strained Si multifaceted devices on a support platform.
Figure 2B:
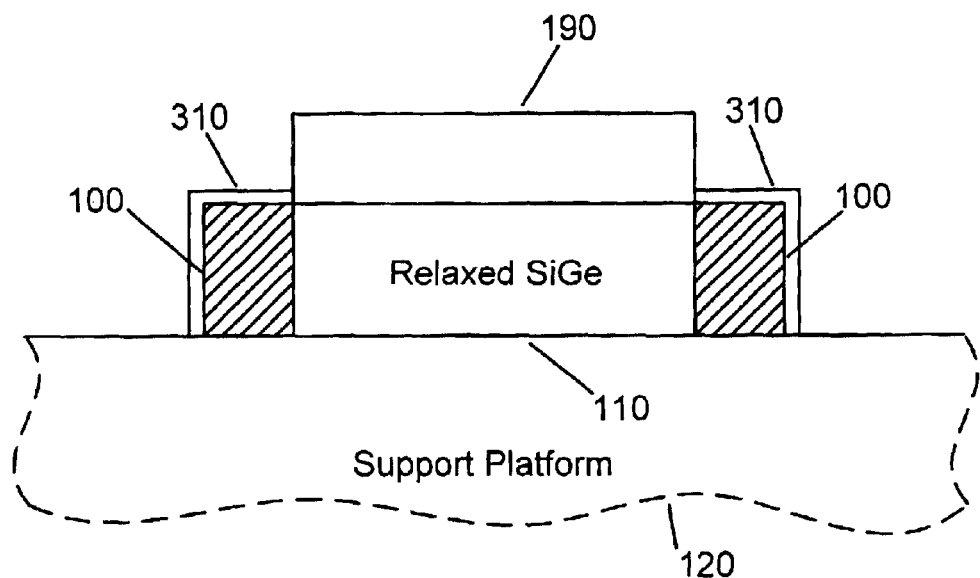
Figure 2C:
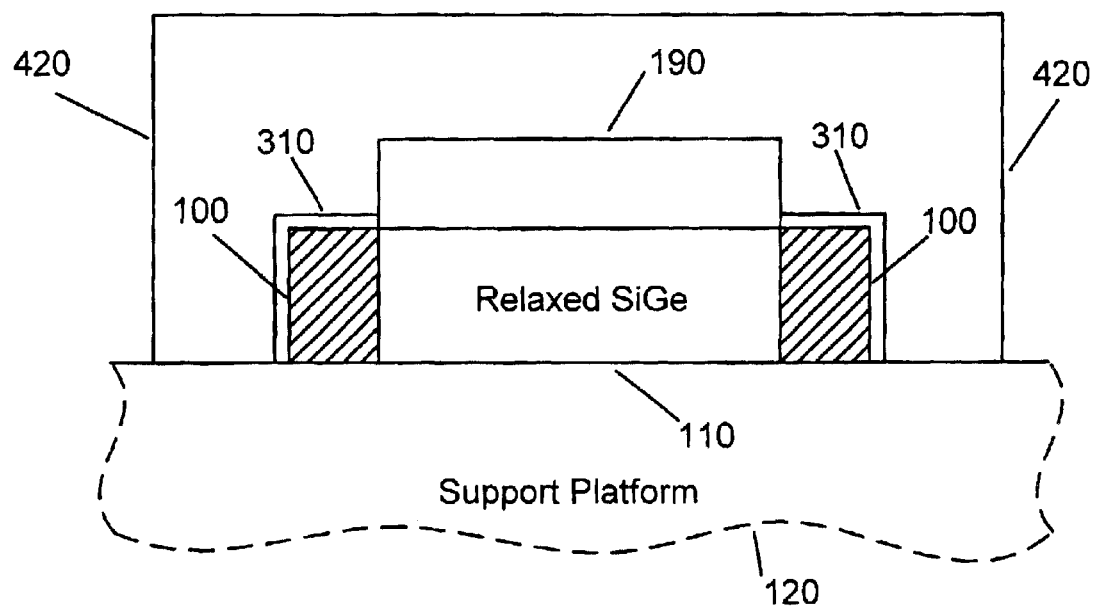

FIG. 2B shows that a first gate insulator 310 is grown onto exposed facets of the Si strip 100. As it is known in the processing arts, such a gate insulator is usually selected from a group consisting of a silicon-oxide, a silicon-nitride, a "low-k" material, a "high-k" material, and combinations of these materials. FIG. 2C shows the depositing a first gate material 420 over the first gate insulator 310, and over the sacrificial cover layer 190. As it is known in the processing arts, such a gate material is typically chosen to comprise polysilicon, or it can comprise a metal, typically a refractory, such as W.

Figure 2D:
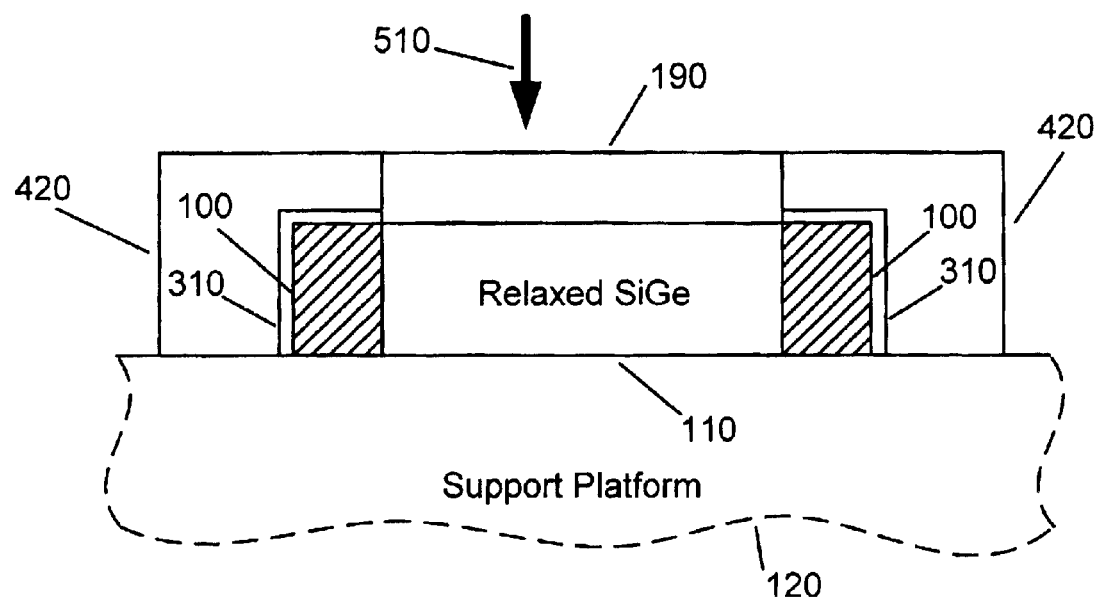
Figure 2E:
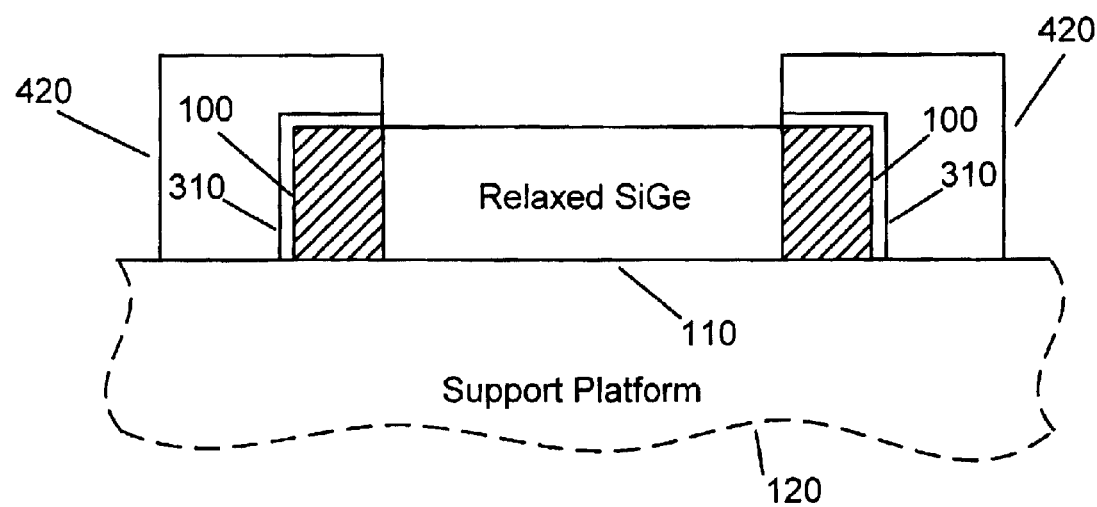
Figure 2F:
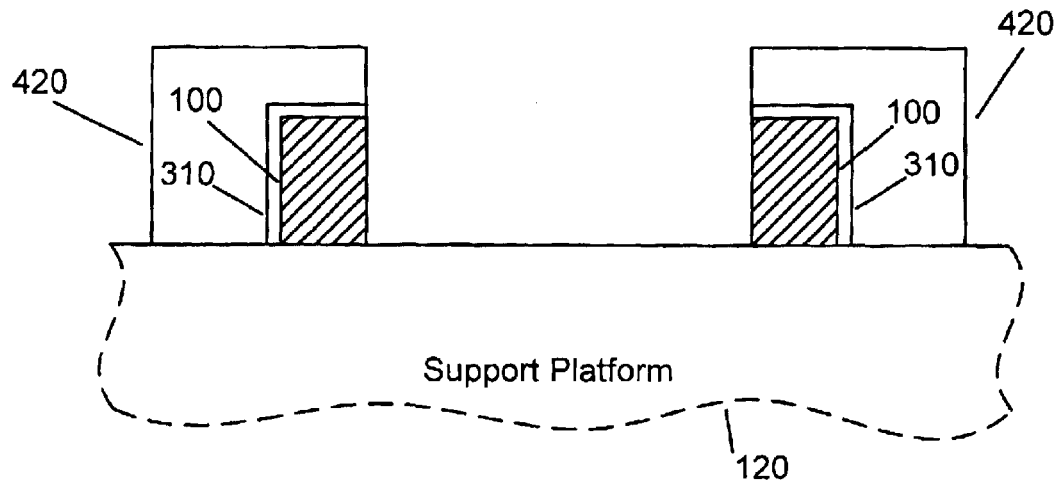

The next step is schematically shown in FIG. 2D, where the top portion of the first gate material is removed in a planar fashion by operation 510. Such a planarizing removal can be achieved by chemical mechanical polish (CMP), or possibly by ion milling. This step reexposes the sacrificial cover layer 190. FIG. 2E shows the method after the stripping, by known selective etching methods, of the sacrificial cover layer 190, whereby the SiGe layer 110 becomes exposed. In FIG. 2F shows the method after the removal of the SiGe layer 110, whereby the monocrystalline Si strip 100 is turned into a multifaceted Si strip bonded to the support platform 120. The removal of the SiGe layer 110 follows the same techniques as discussed in relation with FIG. 1B, namely by selective etchings. In this embodiment the gate insulating layer 310, and the gate material layer 420 play a distinctive role in maintaining the tensilely strained state in the Si strip 100, after the SiGe layer 110 has been removed.

Figure 2G:
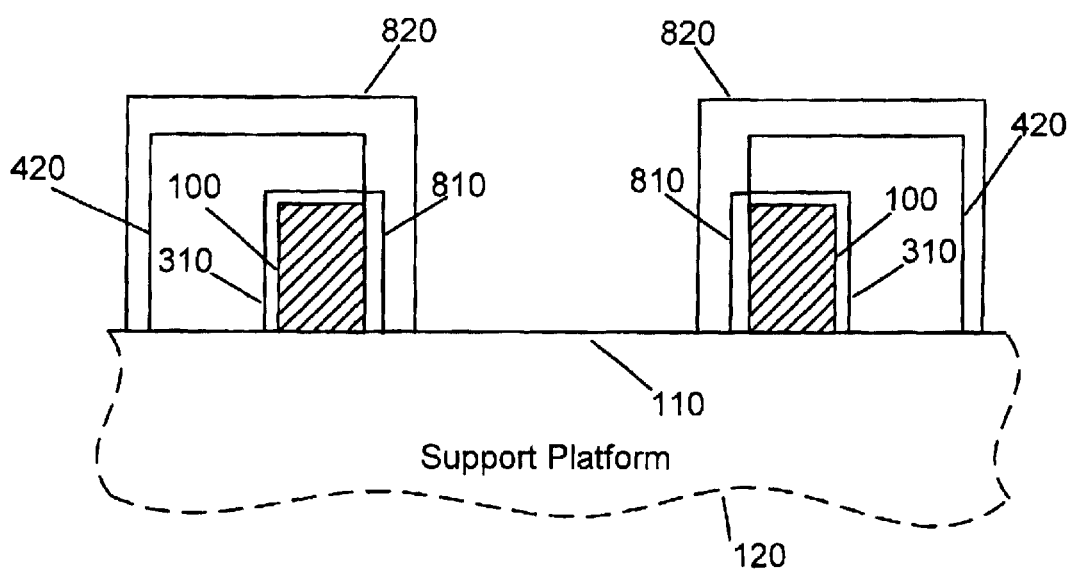

FIG. 2G schematically shows in cross section the FinFET devices with the critical parts of the processing completed. These involve the growing a second gate insulator 810 onto the back facet of the Si strip 100, which this back facet having been exposed in the step of removing the SiGe layer. The next significant step is the depositing of a second gate material 820 over the second gate insulator 810 in a manner that the second gate material 820 connects with the first gate material 420. In this manner the gate materials 420 and 820, although deposited in two separate steps, form a single multifaceted electrical unit. The second gate insulating layer 810, and the second gate material layer 820 also play a role in maintaining the tensilely strained state in the Si strip 100.

Again, as it is known in the processing arts, the second gate insulator 810 is selected from a group consisting of a silicon-oxide, a silicon-nitride, a "low-k" material, a "high-k" material, and combinations of these materials. Also, the second gate material 820 is typically chosen to comprise polysilicon, or it can comprise a metal, typically a refractory, such as W.

These steps are followed by standard device processing steps for completing the FinFET processing on the multifaceted Si strip. Such standard device processing steps are, for instance, the source and drain fabrication.

Figure 3:
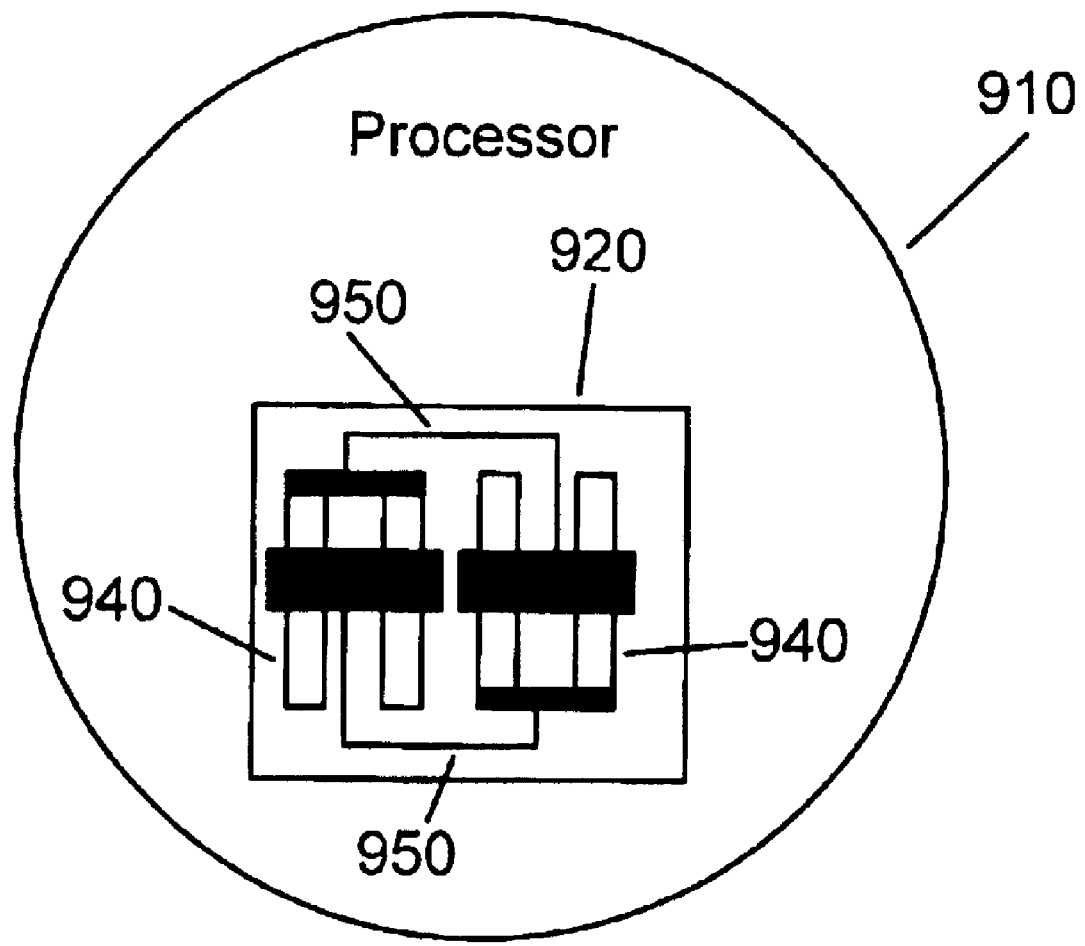
FIG. 3 schematically shows a high performance processor built by methods comprising the strained Si multifaceted devices.

FIG. 3 schematically shows a high performance processor built by methods comprising the strained Si multifaceted devices. Such a processor is typically a digital processor in the central electronic complex (CEC) of a computer. Or, it can be a mixed analog digital processor, such as used in communication technologies. The processor 910 comprises at least one chip 920 which has on its surface logic circuits 950. These logic circuits comprise interconnected FinFET devices 940, fabricated by the methods of this invention. The processor is completed by interconnecting the logic circuits according to a specified design for the processor.

Many modifications and variations of the present invention are possible in light of the above teachings, and could be apparent for those skilled in the art. The scope of the invention is defined by the appended claims.

I claim:

1. A method for producing a strained first material strip, comprising the step of:
   growing by selective epitaxy a monocrystalline first material strip onto a sidewall surface, wherein said sidewall surface belongs to a first monocrystalline layer, and wherein said first monocrystalline layer is bonded to a support platform, and wherein said sidewall surface having a lattice constant which is larger than a relaxed lattice constant of said first material, whereby said first material strip is in a tensilely strained state.

2. The method of claim 1, wherein said first material strip is chosen to be a Si based material.

3. The method of claim 2, wherein said Si based material strip is chosen to be Si.

4. The method of claim 1, wherein said first monocrystalline layer is chosen to be a relaxed SiGe layer.

5. The method of claim 1, wherein said support platform is chosen to comprise a $SiO_2$ layer on a Si substrate.

6. The method of claim 1, wherein said support platform is chosen to comprise a graded SiGe layer on a Si substrate.

7. A method for producing a multifaceted tensilely strained Si strip suitable for fabricating a multifaceted gate MOSFET (FinFET), comprising the steps of:
   growing by selective epitaxy a monocrystalline Si strip onto a sidewall surface, wherein said sidewall surface belongs to a first monocrystalline layer, and wherein said first monocrystalline layer is bonded to a support platform, and wherein said monocrystalline Si strip is also bonded to said support platform, and wherein said sidewall surface having a lattice constant which is larger than a relaxed lattice constant of Si, whereby said Si strip is in a tensilely strained state; and
   removing said first monocrystalline layer, whereby said monocrystalline Si strip is turned into said multifaceted Si strip bonded to said support platform and suitable for fabricating said multifaceted gate FinFET.

8. The method of claim 7, wherein said first monocrystalline layer is chosen to be a relaxed SiGe layer.

9. The method of claim 7, wherein said support platform is chosen to comprise a $SiO_2$ layer on a Si substrate.

10. The method of claim 7, wherein said support platform is chosen to comprise a graded SiGe layer on a Si substrate.

11. The method of claim 7, wherein the step of removing said first monocrystalline layer is executed by a selective wet etch.

12. The method of claim 7, wherein the step of removing said first monocrystalline layer is executed by a selective dry etch.

13. A method for fabricating a tensilely strained Si multifaceted-gate MOSFET (FinFET) device, comprising the steps of:
   providing a monocrystalline relaxed SiGe layer, said SiGe layer having at least one sidewall surface, a top surface, and a bottom surface, wherein said bottom surface is bonded to a support platform;
   growing by selective epitaxy a monocrystalline Si strip onto said at least one SiGe sidewall surface, and wherein said Si strip is bonded to said support platform, whereby said Si strip is in a tensilely strained state;
   removing said SiGe layer, whereby said monocrystalline Si strip is turned into a multifaceted Si strip bonded to said support platform; and
   completing said FinFET processing steps on said multifaceted Si strip.

14. The method of claim 13, wherein said support platform is chosen to comprise a $SiO_2$ layer on a Si substrate.

15. The method of claim 13, wherein said support platform is chosen to comprise a graded SiGe layer on a Si substrate.

16. The method of claim 13, wherein prior to the step of growing by selective epitaxy, is further comprising the step of depositing a sacrificial cover layer onto said top surface of said SiGe layer.

17. The method of claim 16, wherein said sacrificial cover layer is chosen to comprise a dielectric layer.

18. The method of claim 16, wherein following the step of growing by selective epitaxy, is further comprising the steps of:
   growing a first gate insulator onto exposed facets of said Si strip;
   depositing a first gate material over said first gate insulator and said sacrificial cover layer;
   removing a top portion of said first gate material in a planar fashion, whereby exposing said sacrificial cover layer; and
   stripping said sacrificial cover layer, whereby exposing said SiGe layer.

19. The method of claim 18, wherein said first gate insulator is selected from the group consisting of a silicon-oxide, a silicon-nitride, a "low-k" material, a "high-k" material, and combinations of these materials thereof.

20. The method of claim 18, wherein said first gate material is chosen to comprise polysilicon.

21. The method of claim 18, wherein said first gate material is chosen to comprise a metal.

22. The method of claim 13, wherein the step of removing said SiGe layer is executed by a selective wet etch.

23. The method of claim 13, wherein the step of removing said SiGe layer is executed by a selective dry etch.

24. The method of claim 18, wherein the step of completing said FinFET processing comprises the steps of:
   growing a second gate insulator onto a back facet of said Si strip, said back facet having been exposed in the step of removing said SiGe layer; and
   depositing a second gate material over said second gate insulator in a manner that said second gate material connects with said first gate material.

25. The method of claim 24, wherein said second gate insulator is selected from the group consisting of a silicon-oxide, a silicon-nitride, a "low-k" material, a "high-k" material, and combinations of these materials thereof.

26. The method of claim 24, wherein said second gate material is chosen to comprise polysilicon.

27. The method of claim 24, wherein said second gate material is chosen to comprise a metal.

28. A method for building a processor, comprising the steps of:

(a) producing logic circuits on a surface of at least one chip, comprising the steps of:

(1) fabricating a plurality of tensilely strained Si multifaceted-gate MOSFET (FinFET) devices on said surface of at least one chip, comprising the steps of:

providing plurality of monocrystalline relaxed SiGe layers, said SiGe layers having each at least one sidewall surface, a top surface and a bottom surface, wherein each said bottom surface is bonded to a support platform;

growing by selective epitaxy a monocrystalline Si strip onto each of said at least one SiGe sidewall surface, and wherein each of said Si strip is bonded to said support platform, whereby each of said Si strip is in a tensilely strained state;

removing each of said SiGe layer, whereby each of said monocrystalline Si strip is turned into a multifaceted Si strip bonded to said support platform;

completing said FinFET processing steps on each of said multifaceted Si strips;

(2) interconnecting said FinFET devices into said logic circuits on said surface of at least one chip; and (b) interconnecting said logic circuits according to a specified design of said processor.

* * * * *